United States Patent [19]

Germer et al.

[11] Patent Number: 5,025,206

[45] Date of Patent: Jun. 18, 1991

[54] TEST MODE ACTUATOR AND INDICATOR FOR ELECTRONIC ENERGY METER

[75] Inventors: Warren R. Germer, Dover; Peter F. Coryea, Salem; Andrius A. Keturakis, Portsmouth, all of N.H.; David H. Masury, Kittery Point; Thomas H. Stevens, Cape Neddick, both of Me.

[73] Assignee: General Electric Company, Somersworth, N.H.

[21] Appl. No.: 411,940

[22] Filed: Sep. 25, 1989

[51] Int. Cl.⁵ .................... G01R 35/04; G01R 21/00
[52] U.S. Cl. ...................................... 324/74; 324/142; 324/157
[58] Field of Search ................. 324/74, 142, 156, 157, 324/115; 200/542

[56] References Cited

U.S. PATENT DOCUMENTS

| | | | |
|---|---|---|---|
| 992,539 | 5/1911 | Blokusewski | 324/74 |
| 1,036,294 | 8/1912 | McHarg | 200/542 |
| 2,466,558 | 4/1949 | Saldon | 324/115 |

Primary Examiner—Ernest F. Karlsen
Attorney, Agent, or Firm—Robert E. Brunson; Irving M. Freedman

[57] ABSTRACT

A unitary combination actuator and indicator flag for an electronic energy meter. The integral actuator and mode indicator is slidable within the bezel of the meter and in the off position is not visible. Sliding the actuator simultaneously moves a camming surface over an axially moveable switch to connect the meter test mode, and slides a visible "TEST" flag over the digital readout window to indicate that the watthour meter is in the test mode. Positive actuation and positioning members are included for both the off and on positions.

41 Claims, 5 Drawing Sheets

FIG_1

FIG_2

FIG_3

FIG_4

FIG_5

FIG_6

FIG_7

FIG_8

FIG_9

FIG_10

FIG_11

FIG_12

FIG_13

FIG_14

FIG_15

FIG_16

FIG_17

FIG_18

TEST MODE ACTUATOR AND INDICATOR FOR ELECTRONIC ENERGY METER

BACKGROUND OF THE INVENTION

Electronic registers and meters taking advantage of the expanded data processing capabilities inherent in such devices have been provided with built in test capabilities, and may include a "test mode" in which various functions and operation of the equipment may be displayed and tested. However, the test mode is not the normal mode of operation and may be actuated and utilized only at those relatively infrequent times when a serviceman is checking or repairing the electronic energy meter. As a result, the switch provided to transfer operation of the test mode has been of the momentary contact type, that is the test mode is actuated and maintained only as long as pressure is maintained to actuate the switch. However, during testing or repair it may become necessary to actuate the test mode for more than a brief period of time. Accordingly, it has become desirable to provide a test mode switch which is not of the momentary contact type. Also, it is desirable to provide a flag or indication that the energy meter has been switched to the test mode to remind the serviceman to turn off the test mode actuator switch when the testing is completed.

In addition, it is desirable in a energy meter that test functions, actuators, and indicators be unobtrusive and not clutter the meter face during the normal periods when meter reading is accomplished by non-service personnel, in order to avoid confusion in meter reading, and also to minimize unintended operation of test functions. Further, the actuator for the test function should be readily accessible yet not obvious to one not aware of its presence.

Notwithstanding that servicemen or technicians normally utilize the test function, it is desirable that actuation of the test function be accomplished without special tools or even a screwdriver.

OBJECTS AND SUMMARY OF INVENTION

Accordingly, it is an object of the present invention to provide an improved test mode switching arrangement for an electronic energy meter which includes an indicator of the test mode.

It is a further object of the present invention to provide an improved test mode switching arrangement for an electronic energy meter, including a test mode indicator which is uncomplex, reliable and positive in operation.

It is a still further object of the present invention to provide an improved test mode switching arrangement for an electronic energy meter which is unobtrusive and does not complicate the meter reading when not in operation.

It is another object of the present invention to provide a test mode actuator for an electronic energy meter which can be actuated without any special tools, and which remains on until deactuated.

In accordance with preferred embodiments of the invention, an integral actuator and mode indicator is slidably mounted in the top bezel of an electronic energy meter. In the test mode, the actuator/indicator is slid over a portion of the meter readout to expose a test warning on the upper surface, while at the same time a cam on the lower surface actuates the test mode switch. Positive actuation and positioning members are included, and the cam depresses a plunger to force a conducting surface across the connections which switch the test functions on for display on the meter readout. The mode indicator ma be translucent to enable selected information to be displayed beneath and through the mode indicator.

Figure 1:
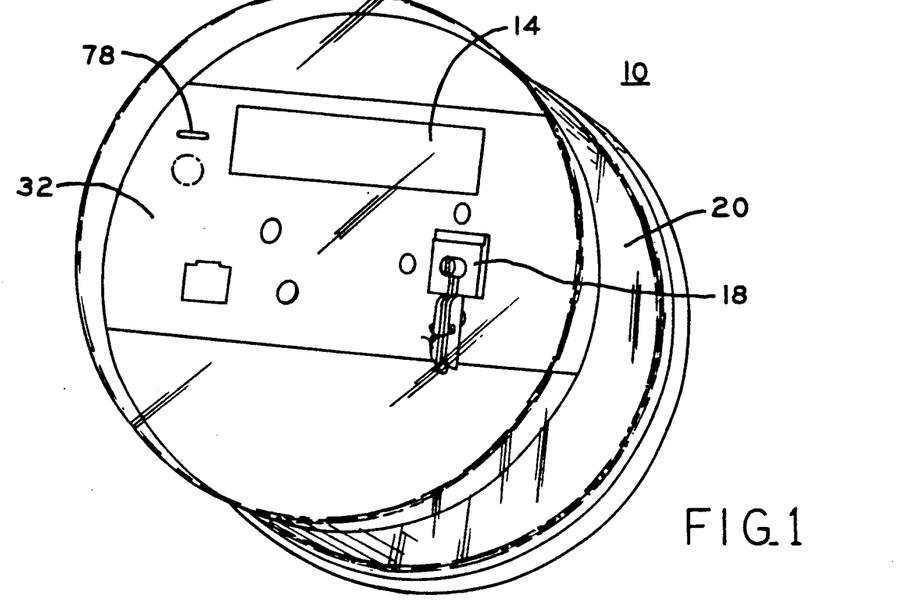
FIG. 1 shows an electronic energy meter incorporating one embodiment of the present invention.
Figure 2:
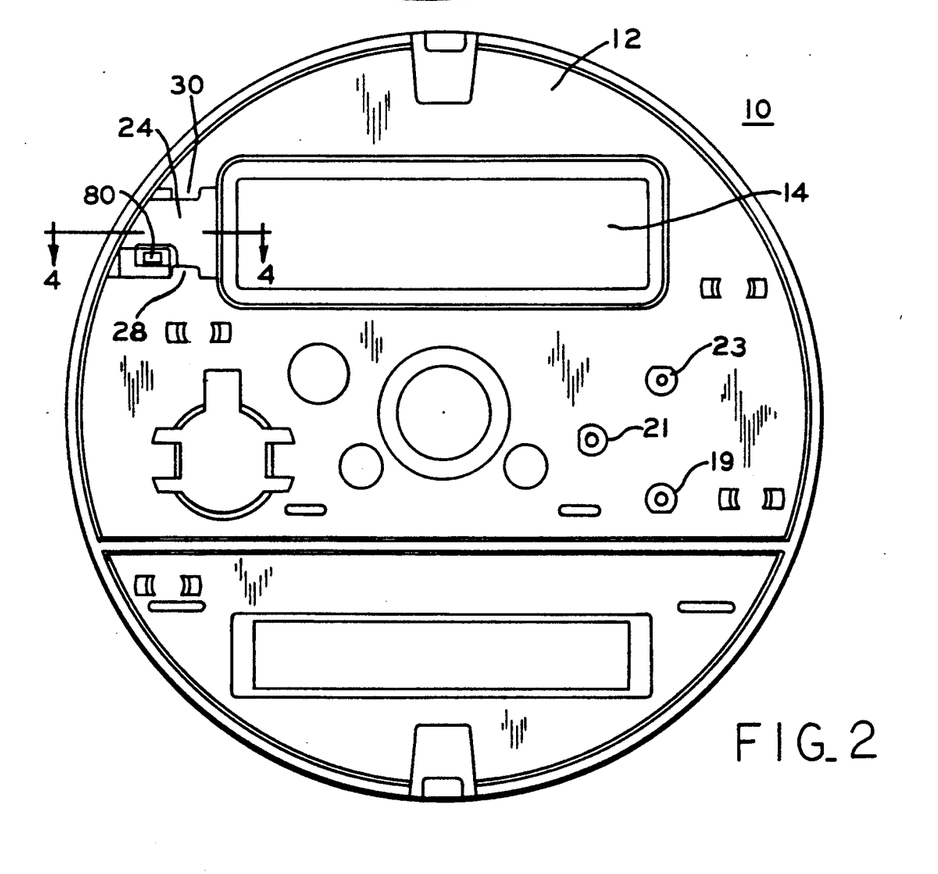
FIG. 2 is an enlarged top view of the bezel of the meter of FIG. 1.

Referring to FIGS. 1 and 2, an electronic energy meter 10 includes a generally cylindrically shaped bezel support member 12 with a digital display window or meter readout 14 which comprises a liquid crystal display (LCD) positioned behind the bezel. The LCD readout normally displays the total watthour consumption of the load, home, or facility, the power lines of which are connected to and through the electronic energy meter 10. Details of the construction of an electronic energy meter which incorporates the present invention are set forth in copending U.S. patent application Ser. No. 411,934 filed Sept. 25, 1989 by W. R. Germer, M. J. Ouellette, D. F. Bullock and A. F. Palmer, assigned to the same assignee as the present invention, and hereby incorporated by reference.

The electronic energy meter 10 includes the capability of displaying or providing a plurality of different types of information such as test function information, power consumption information, and operational information. A rotary switch actuator 18 which is positioned on, and extends through, the transparent case 20 of the meter may be readily accessed and actuated by the meter reader to cause the meter to perform Monthly Reset, Display and/or Self Check functions with associated display of information by the depression of actuator 18 of plunger switches 19, 21, and 23. For details of the construction and operation of a rotary switch 18 suitable for use with the present invention, reference may be made to U.S. Pat. No. 4,602,211 issued July 22, 1986 to P. F. Losapio and W. R. Germer, and assigned to the same assignee as the present invention, and also to Copending U.S. patent application, Ser. No. 411,963 of P. F. Coryea and W. R. Germer, filed Sept. 25, 1989, now U.S. Pat. No. 4,959,607, assigned to the same assignee as the present invention, and which is hereby incorporated by reference. The test operation of electronic demand registers is described in detail in U.S. Pat. No. 4,598,248 issued July 1, 1986 to W. R. Germer and assigned to the same assignee as the present invention.

In addition, provision is made for the actuation of the test mode for electronic energy meter 10 to display selected operational information on the meter readout 14 which will indicate to the serviceman or technician operational aspects of the electronic energy meter 10 and assist in a determination of whether the meter is operating properly, or requires removal and/or servicing.

The test mode actuator/indicator 24 slides under the rim 38 of bezel 12 substantially parallel to, and overlapping LCD readout 14 in the actuated position. The moveable member 24 slides in guides 28 and 30 which are molded as part of the bezel 12, and overlie segments of the slot 34 (shown in FIG. 3) in which the test mode actuator/indicator 24 slides.

Figure 3:
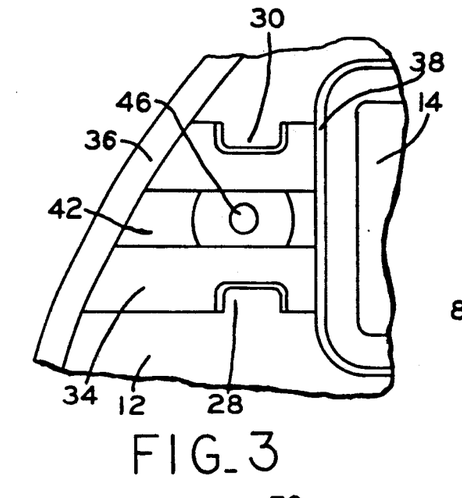
FIG. 3 is an enlarged view of a portion of the bezel of FIG. 2.

Referring to FIG. 3, it is seen that the slot 34 extends from the circumferential rim 36 of the bezel 12, passes beneath and beyond the guides 28 and 30, to under the raised rim 38 around the LCD readout window 14. Assembly of the actuator/indicator member 24 into the slot 34 is accomplished from the opening in the bezel 12 into which the LCD readout 14 is later placed.

Figure 4:
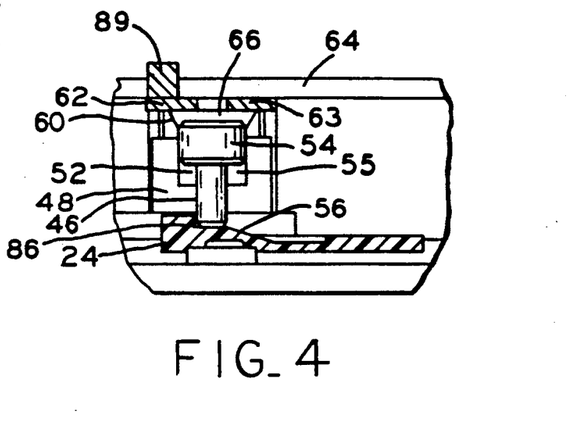
FIG. 4 is an enlarged cross-sectional view of a portion of the test mode actuator/indicator of FIG. 2, taken along the line 4—4 of FIG. 2, and including the switch and associated components.

In the central region of the slot 34, underlying the switching cam guide 42, is an aperture 46 defined by cylindrical boss 48 which is best shown in FIG. 4, which also includes the switch and associated components. Referring to FIG. 4, a shaft or pin 52 extends through the aperture 46 to the cylindrically shaped axial switch actuator 54. The switch actuator 54 moves within a cylindrical aperture 55 in the bottom of the cylindrical boss 48. In FIG. 4 the moveable actuator/indicator 24 has been moved to the right, that is to the "On" or test mode, such that the switching cam surface of switching component 56 has forced the axial actuator 54 against switch 60 to force its conducting surface 66 into contact with a plurality of conductors 62 on circuit board 64. The switch 60 maybe of the type sold by SP America of San Jose, California, as their Klik-Key BM-G switch, and comprises a snap acting rubber body including a central conducting rubber disk 66. When the test mode actuator/indicator 24 is moved to the left so as to move the switching cam surface 56 out from under the shaft or moveable connecting member 52, the compressed resiliency of the switch 60 forces the central conducting disk 66 away from the conductors 62 on circuit board 64 to open the test mode circuit, and to return the electronic energy meter 10 to its normal power indicating mode.

The details of the test mode actuator/indicator member 24 are shown in FIGS. 5-10. Referring to FIGS. 5-10, and first to FIG. 5, it is seen that the test mode actuator/indicator 24 is generally rectangular in shape with a triangular portion removed from the corner region 70 to allow the outer edge 72 and taper edge 74 to generally conform to the interior of the circumferential rim 3 of the bezel 12 as best shown in FIG. 2. Positioned along inner edge 76 is the engraved word "TEST" 75 extending along the inner edge 76 and perpendicular to the direction of movement of the test mode actuator/indicator 24. The word or indicia "TEST" 75 is normally positioned under the nameplate 32 such that it is not visible and comes into view only when the actuator/indicator 24 is moved to the right, which movement also actuates the switch 60 through the switching cam surface 56. Thus, sliding the actuator/indicator 24 to the right simultaneously actuates the test mode circuitry and provides a visual indication by inserting the indicator "TEST" into the window opening of the LCD readout 14. The actuator/indicator 24 is molded from a red translucent polycarbonate and the letters spelling out "TEST" are impressed into the translucent polycarbonate material and may be painted white in order to be highly visible when the test mode indicator is displayed. However, since the material is translucent it is possible to provide information in the readout 14 which is positioned behind the actuator/indicator 24 and highly visible when in the test mode. In addition, when the test mode actuator/indicator 24 is in the unactuated, or Off position, it is unobtrusive since there is no indication on the face of the meter regarding the test mode until the test mode actuator/indicator is actuated. Actuation of test mode actuator/indicator 24 is accomplished through slot 78 (best shown in FIG. 1) in the nameplate 32 which is positioned over the indentation 80 in the actuator/indicator. The indentation 80 may be accessed through the slot 78 in the nameplate by the point of a pencil or similar object, in order to slide the actuator/indicator 24 from side to side. Thus, the actuator/indicator 24 may be operated without the use of any special tooling, and is inconspicuous and not readily apparent to anyone, except a person such as a serviceman, who has been made aware of its existence.

Figure 6:
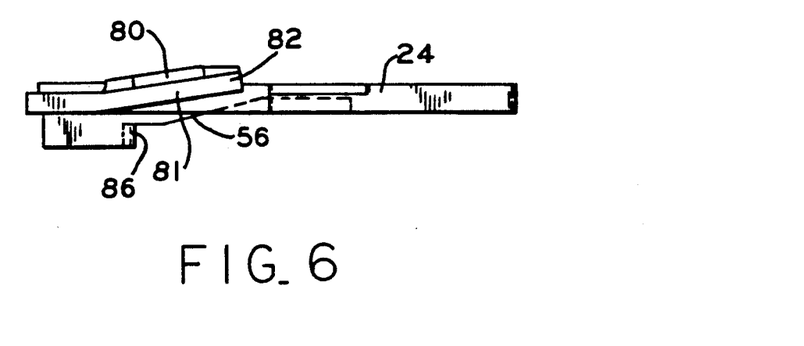
FIG. 6 is a side view of FIG. 5.
Figure 7:
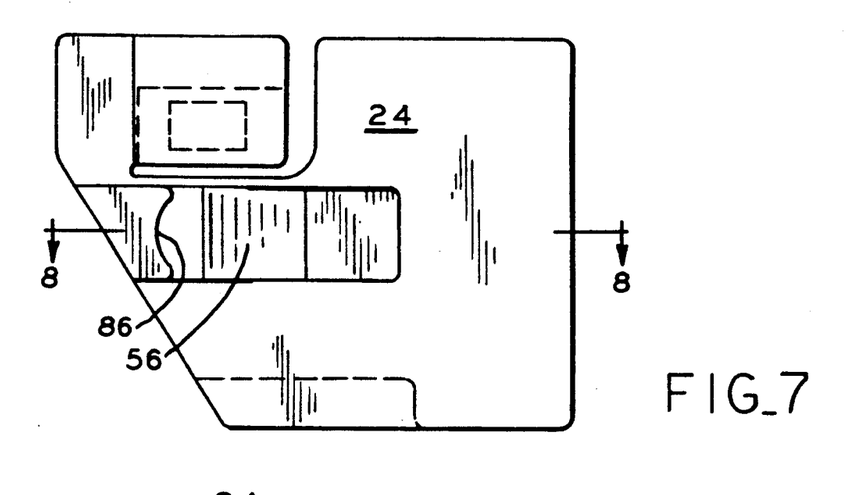
FIG. 7 is a bottom view of FIG. 5.

As best shown in FIG. 6, the indentation 80 is positioned within an upwardly extending tab 81 which is molded integral with the actuator/indicator 24 and cantilevered at the outer edge 72, such that the outer edge 72 provides a resilient depressible latch or stop. In the "Off" position the free end 82 of tab 81 abuts against the guide 28 (best shown in FIGS. 2 and 3). This securely locks the actuator/indicator 24 in the Off position until actuated, and prevents any movement due to vibration or shock. When the actuator/indicator 24 is actuated by a pencil or other object pressed against the indentation 80, the pressure depresses the resilient upwardly extending tab 81 so that end 82 passes beneath the guide 28, and the actuator/indicator may then be slid easily to the right or "On" position. FIG. 7 shows the stop for the actuated or "On" position. Referring to FIG. 7, and also to FIG. 4, it is seen that the bottom of the actuator/indicator 24 has molded integral therewith, and in line with the switching component or cam surface 56, a curved stop or abutment 86 which, as shown in FIG. 4, contacts the shaft or pin 52 of the axial actuator 54 to provide a positive stop in the "On" position.

Figure 5:
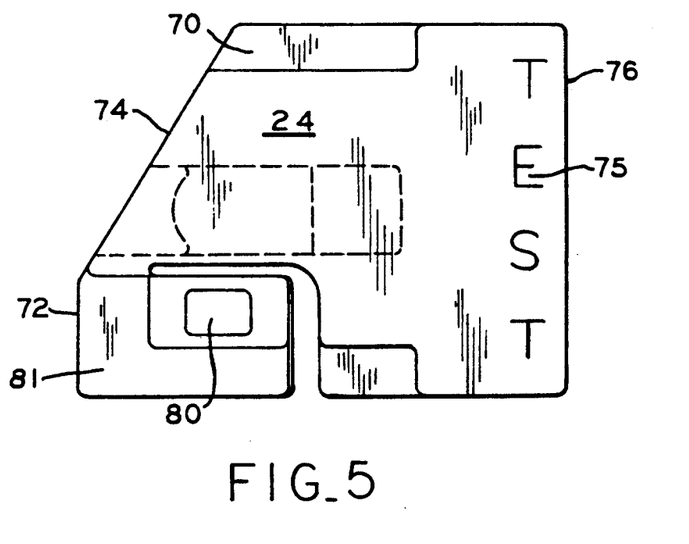
FIG. 5 is an enlarged view of the test mode actuator-/indicator member.
Figures 8, 9:
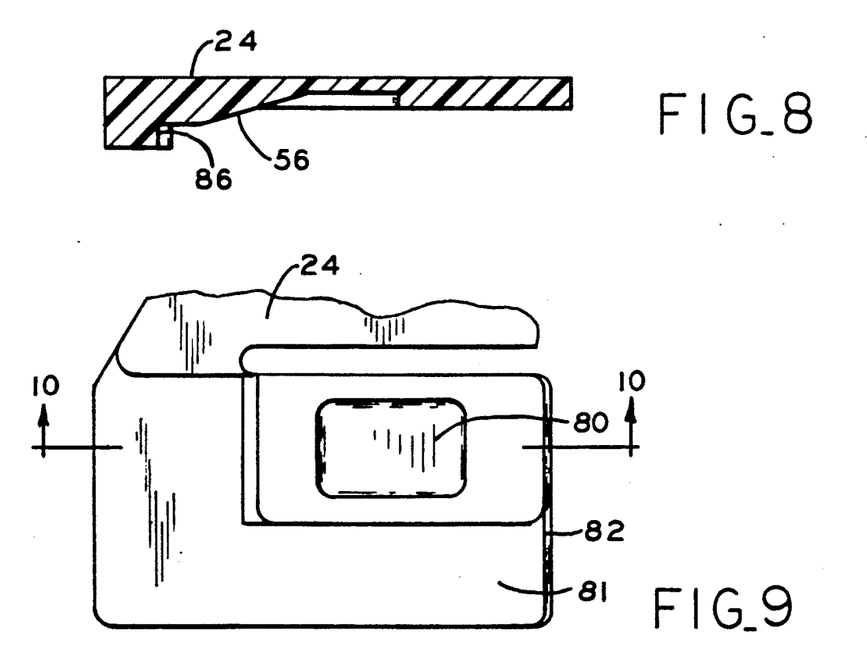
FIG. 8 is a cross section taken along the line 8—8 in FIG. 7.
FIG. 9 is an enlarged portion of FIG. 5.
Figure 10:
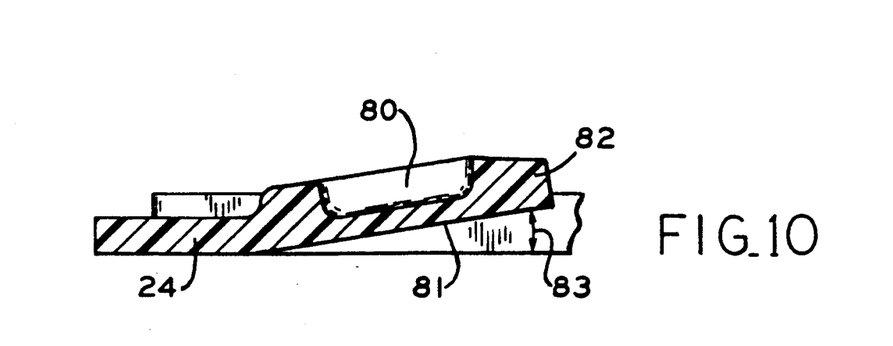
FIG. 10 is a cross section taken along the line 10—10 in FIG. 9.

FIGS. 9 and 10 are enlarged views of the resilient, upwardly extending tab 81 described in connection with FIGS. 5 and 6. Referring to FIGS. 9 and 10, it is to be noted that the angle 83 at which the tab 81 extends is approximately 9 degrees so that only a relatively small downward pressure and movement on indentation 80 is required for the free end 82 of the tab 81 to clear the guide 28 in order to slide below the guide.

Figure 11:
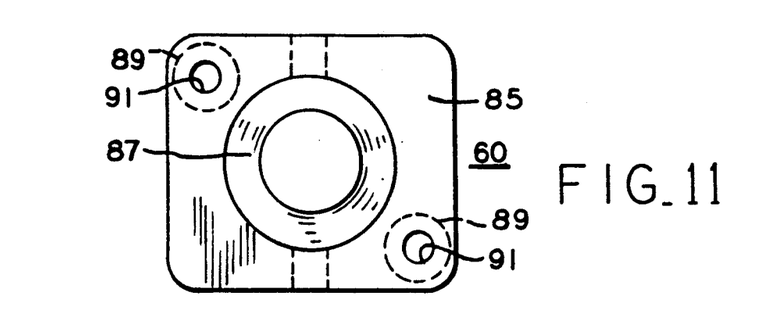
FIG. 11 is a bottom view of a rubber key switch which may be used in the present invention.
Figure 12:
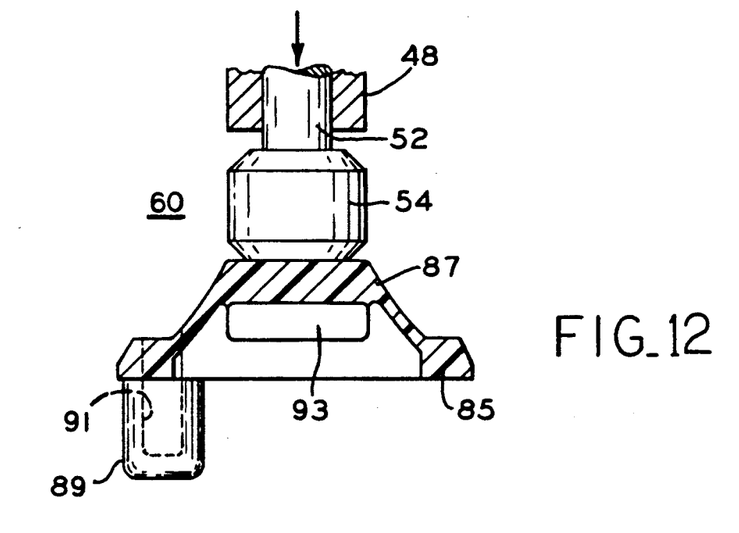
FIG. 12 is a side view of the switch shown in FIG. 11 with a portion in cross section and including the associated switch actuator.

The rubber key switch 60 is shown in FIGS. 11 and 12. Referring to FIGS. 11 and 12, the switch 60 includes a generally rectangular shaped base 85, and a cup shaped central region 87, best shown in FIG. 12. A pair of mounting bosses 89 are positioned adjacent opposite corners, each including apertures 91 to facilitate the mounting of the switches to the circuit board 64. A conductive segment or button 93 is positioned inside the cup shaped central region 87. Downward movement of the axial actuator 54, as shown in FIG. 12, compresses the cup shaped central region 87 of the switch 60 such that the conductive button 93 moves into contact with the conductors such as 62 on the circuit board 64. (See FIG. 4.)

Figure 13:
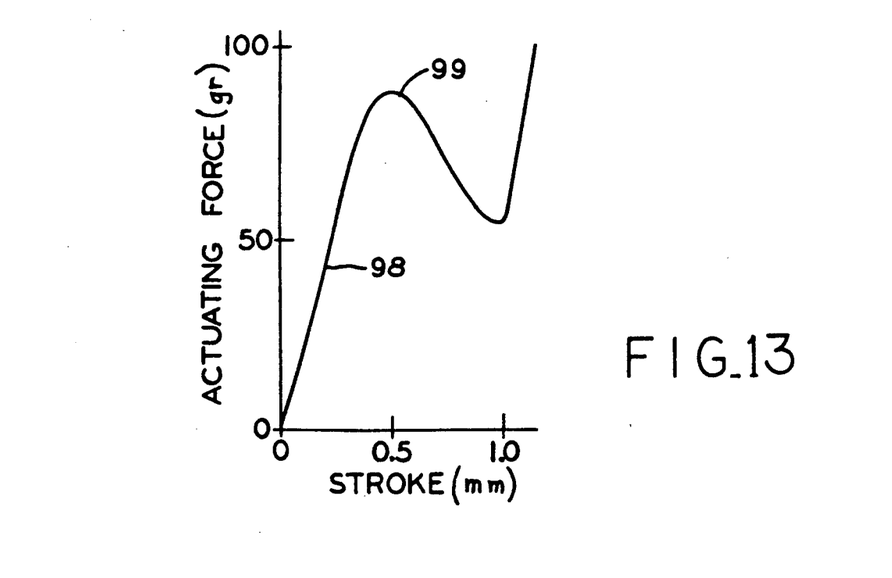
FIG. 13 is a plot of stroke versus actuating force for the switch shown in FIGS. 11 and 12.

FIG. 13 shows a plot of the stroke or movement of the conductive button 66 of switch 60 in millimeters, plotted against the actuating force in grams applied by the axial actuator 54. Referring to FIG. 13, it is seen from the plot 98 that increased actuating force provides linear movement of the switch and the conductive button 66 until the region 99, where the rubber cup shaped central region 87 is depressed sufficiently to provide a snap action such that increased stroke is obtained with decreased actuating force. That is, the rubber cup shaped central region 87 snaps downward to provide snap action switching.

Figure 14:
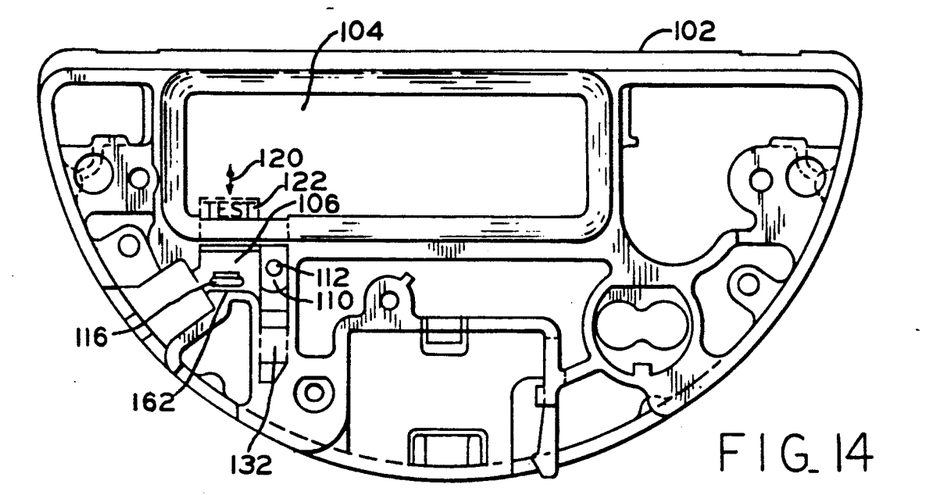
FIG. 14 shows an alternate embodiment of the present invention.

FIGS. 14-18 show an alternate embodiment of the present invention. Referring first to FIG. 14, a bezel or enclosure 102, formed generally in the shape of a cylinder with a flatted end, includes a window or LCD readout opening 104 and an actuator/indicator cavity 106, positioned under the left side of the readout opening 104. Included in the bezel is a cylindrical boss 110 which extends below the bezel with a central aperture 112, below which a switch (not shown) is positioned and through which an axial moveable shaft or pin (not shown) is moved by the actuator/indicator in the manner described in connection with the embodiment shown in FIGS. 1-13 above. An elongated, rounded recess 116 is provided in the surface of the bezel in the actuator/indicator cavity 106. The vertical test mode actuator/indicator 126 moves in the direction shown by the arrow 120, and in the on position the test mode indicator 122 is positioned as shown dotted in FIG. 14.

Figure 15:
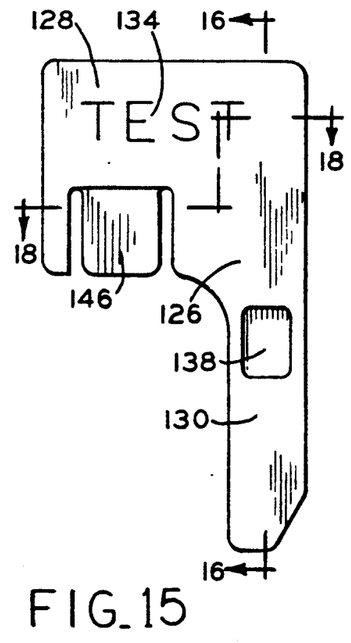
FIG. 15 is a top view of the test mode actuator/indicator member for FIG. 14.
Figure 16:
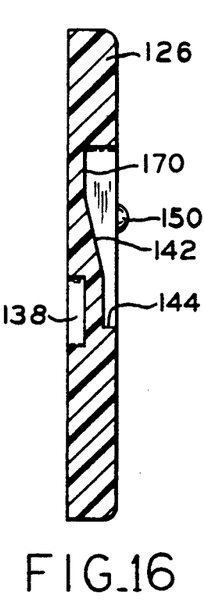
FIG. 16 is a cross-sectional side view of FIG. 15 taken along lines 16—16 in FIG. 15.
Figure 17:
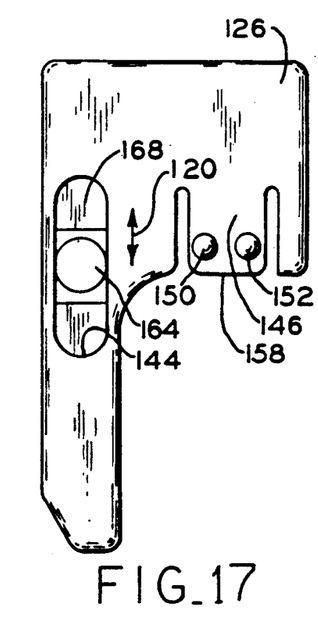
FIG. 17 is a bottom view of FIG. 15.
Figure 18:
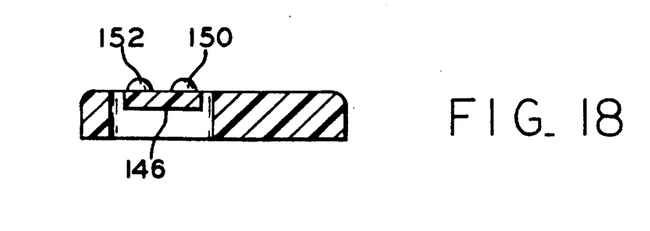
FIG. 18 is a cross-sectional end view of FIG. 15 taken along lines 18—18 in FIG. 15.

Referring next to FIG. 15, the test mode actuator/indicator 126 is roughly L-shaped, including a rectangular section 128 and an extending portion 130. At the upper end of the rectangular portion 128 is the test mode indicia "TEST" 134. Through the actuating slot in the name plate (not shown), the indentation 138 is used to slide the test mode actuator/indicator 126 within the cavity 106 in the manner essentially as described above in connection with the embodiment of FIGS. 1-13. Referring next to FIGS. 16, 17, and 18 in addition to FIG. 15, it is seen that the extending portion 130 includes on its lower surface the switching component or cam surface 142, with the contiguous rounded stop surface 144 which limits the travel of the test mode actuator/indicator 126 in the On position.

The central section 146 of the rectangular portion 128 includes a pair of latching and friction buttons 150 and 152 also molded as part of the integral test mode actuator/indicator 126. In the Off position, the lower end or tab 158 of the central section 146 abuts the stop surface 162 in the bezel 102 (shown in FIG. 14) and the latching and friction buttons 150 and 152 are positioned within the elongated rounded recess 116 (also shown in FIG. 14). The latching and friction buttons 150 and 152 prevent accidental movement of the test mode actuator/indicator 126 toward the readout opening 104, or toward the On position, while the stop surface 162 prevents movement in the opposite direction beyond the Off position.

Insertion of a pencil or other rounded object through a slot in the name plate (not shown) with pressure toward the readout opening 104 causes the test mode actuator/indicator 126 to move in the upward direction 120 toward the readout opening, and causes the latching and friction buttons 150 and 152 to ride up over, and past, the elongated and rounded recess 116 until the actuator/indicator moves to the position shown by 122 in FIG. 14. At that position the stop surface 144 encounters the shaft or pin 164 (shown in FIG. 17) of the axial indicator to provide a positive stop in the On position. At the same time, the movement of the cam surface 142 past the shaft or pin of the axial actuator 164 forces the axial actuator downward to actuate the switch in the manner described above in connection with FIGS. 1-13. Thus, in the Off position the shaft or pin 164 is adjacent the opening 170 in slot 168. Actuation of the test mode actuator/indicator 126 upward moves the cam surface 142 past the shaft or pin 164 driving it downward and the upward movement also moves from the test mode indicia 134 out from the concealed position under the nameplate to be conspicuously displayed as shown in FIG. 14. At the same time, as the cam surface 142 moves over the shaft or pin of axial actuator 164 and drives it downward, the switch is snapped to the On position and the upward movement is stopped by the shaft or pin 164 contacting the stop surface 144.

In accordance with the embodiments described above, a test mode actuator/indicator has been provided which is inconspicuous and unobtrusive and not readily apparent when in the "Off" position, and which may be readily actuated without tools by a serviceman by merely placing a pencil or similar object in a slot in the nameplate to slide the actuator/indicator, simultaneously uncovering the test flag with the word "TEST" and through the camming surface actuating the switch which energizes the circuitry to place the energy meter in the test mode. At the same time, the translucent flag, while readily visible and conspicuous within the window 16 of the readout 14, enables information to be displayed below and through the test flag. If desired, the energy meter 10 could be programmed to display a message in the LCD readout 14 after a preset period of time after the actuator/indicator 24 is moved to the Test position indicating that the actuator/indicator should be returned to the Off position if testing is complete.

Thus, while the present invention has been described through preferred embodiments such embodiments are provided by way of example only. Numerous variations, changes and substitutions, including those discussed above, will occur to those skilled in the art without departing from the scope of the present invention and following claims.

What we claim is:

1. An integral test mode actuator and indicator in an electric energy meter comprising:
   a register to indicate the amount of electricity used including a bezel support member and an associated meter readout;

an actuator/indicator member movably mounted within a recess associated with said bezel and having an off position, and an on position, and bearing a test mode indicia flag;

said actuator/indicator member being substantially obscured from view in said off position and including a switching component;

switch means having a switch actuator positioned in the path of said switching component and said activator/indicator;

movement of said actuator/indicator member from said off position to said on position moving said switching component into contact with said switch actuator to switch said member to the test mode;

said movement of said actuator/indicator member to the on position also moving said test mode indicia flag into the visible region associated with said meter readout; and return of said actuator indicator member to the off position substantially removing said test mode indicia from view and back into said recess in said bezel and simultaneously moving said switching component away from contact with said switch actuator to switch said test mode of said meter off.

2. The integral electric meter test mode actuator/indicator of claim 1 wherein said actuator/indicator member is slidable within said recess, and includes stops for said on position and said off position.

3. The integral electric meter test mode actuator/indicator of claim 2 wherein said register includes guides to direct the sliding of said actuator/indicator member.

4. The integral electric meter test mode actuator/indicator of claim 1 wherein said register includes an opening to provide access to slide said actuator/indicator member between said on and off positions.

5. The integral electric meter test mode actuator/indicator of claim 4 wherein said opening is a slot in a nameplate overlying said bezel.

6. The integral electric meter test mode actuator/indicator of claim 3 wherein said switching component is a cam surface.

7. The integral electric meter test mode actuator/indicator of claim 6 wherein said switch actuator is axially moveable to press a conductive surface of said switch means against conductors in said electric meter to activate the test mode operation.

8. The integral electric meter test mode actuator/indicator of claim 5 wherein said actuator/indicator member includes an indentation in the region below said slot, adapted to receive a pointed object such as a pencil through said slot to enable said actuator/indicator to be slid between said off and on positions by pressure provided to said indentation.

9. The integral electric meter test mode actuator/indicator of claim 8 wherein said indentation is positioned on a resilient upwardly extending tab on said actuator/indicator member, and the free end of said tab in said off position is positioned adjacent a projecting surface on said bezel, which projecting surface is interposed between said free end and said meter readout to prevent accidental movement of said actuator/indicator member toward said meter readout.

10. The integral electric meter test mode actuator/indicator of claim 9 wherein pressure on said indentation depresses said resilient upwardly extending tab below said projecting surface on said bezel to enable said actuator/indicator member to slide toward said meter readout and said on position.

11. The integral electric meter test mode actuator/indicator of claim 10 wherein said switching component is a cam surface and said actuator/indicator member includes a stop surface adjacent said cam surface to stop the movement of said actuator/indicator member when it reaches said on position.

12. The integral electric meter test mode actuator/indicator of claim 11 wherein said switch means includes an axially moveable connecting member interposed between said cam surface of said switching component and said switch means, whereby movement of said actuator/indicator member from said off position to said on position cams said connecting member toward said switch means to actuate said switch means.

13. The integral electric meter test mode actuator/indicator of claim 12 wherein said switch means comprises a resilient surface adjacent said axially moveable member on one side, and a central conducting member on the opposite side positioned adjacent conductors associated with the actuation of said test mode.

14. The integral electric meter test mode actuator/indicator of claim 13 wherein said resilient surface of said switch means is cup shaped to provide a positive snap actuation for said switch means.

15. The integral electric meter test mode actuator/indicator of claim 14 wherein a boss in said bezel, having a central aperture through which said axially moveable connecting member passes, supports and guides said connecting member in moving between the off and on positions for said test mode.

16. The integral electric meter test mode actuator/indicator of claim 15 wherein said actuator/indicator member is a translucent polycarbonate molding.

17. The integral electric meter test mode actuator/indicator of claim 16 wherein said actuator/indicator member is a highly visible bright color.

18. The integral electric meter test mode actuator/indicator of claim 17 wherein the test mode indicia is engraved in the end of said actuator/indicator closest to said meter readout.

19. The integral electric meter test mode actuator/indicator of claim 18 wherein said test mode indicia overlies a portion of said meter readout when said actuator/indicator is in said on position, and is substantially concealed within said register when said actuator/indicator is in said off position.

20. The integral electric meter test mode actuator/indicator of claim 19 wherein said actuator/indicator member shows no indicia regarding test mode testing when said actuator/indicator member is in the off position.

21. The integral electric meter test mode actuator/indicator of claim 20 wherein said meter readout is substantially rectangular in shape with opposed longer sides and opposed shorter sides and said test mode indicia is moved parallel to said longer sides when moved between said off and on positions.

22. The integral electric meter test mode actuator/indicator of claim 20 wherein said meter readout is substantially rectangular in shape with opposed longer sides and opposed shorter sides and said test mode indicia is moved substantially perpendicular to said longer sides when moved between said off and on positions.

23. An integral test mode indicator and actuator in an electronic digital energy meter comprising:

a meter bezel support member including a digital readout;

a molded integral actuator/indicator member slidably mounted within a recess in said bezel between an off position and an on position;

said actuator/indicator member bearing test mode indicia flag on the end adjacent said digital readout which is conspicuously displayed only when said actuator/indicator member is moved toward said on position;

said indicia being inconspicuous when said actuator/indicator member is in the off position;

a camming surface integral with, and extending below, said actuator/indicator member opposite the side displaying said test mode indicia;

a switch positioned below said camming surface, and including a resilient member with a moveable connecting member interposed between said camming surface and said resilient member; and means to facilitate the sliding of said actuator/indicator member between said off position and said on position such that actuation from said off position to said on position moves said camming surface into increasing contact with said axially moveable connecting member to actuate said switch, and to also move said test indicia flag from the inconspicuous off position to the conspicuous on display position at one end of said digital meter readout.

24. The integral electric energy meter test mode actuator/indicator of claim 23 wherein said actuator/indicator member includes an upwardly extending tab with a free end which abuts a projecting surface of said meter bezel to provide a stop for said off position, such that pressure on said upwardly extending tab will depress said tab to enable it to slide beneath said projecting surface toward said on position.

25. The integral electric energy meter test mode actuator/indicator of claim 24 wherein an abutment extends below said camming surface to contact said axially moveable connecting member to provide a stop to further movement of said actuator/indicator member toward said on position when said abutment is reached.

26. The integral electric energy meter test mode actuator/indicator of claim 25 wherein said bezel include guides to position, and facilitate the sliding of, said actuator/indicator member.

27. The integral electric energy meter test mode actuator/indicator of claim 26 wherein a slot is provided through a planar member over said bezel to provide access to said actuator/indicator member.

28. The integral electric energy meter test mode actuator/indicator of claim 27 wherein said actuator/indicator member includes an indentation in the region below said slot adapted to receive a pointed instrument such as a pencil to enable said actuator/indicator member to be slid between said off position and said on position by pressure provided through said indentation.

29. The integral electric energy meter test mode actuator/indicator of claim 28 wherein said actuator/indicator member is a translucent polycarbonate of a highly visible color.

30. The integral electric meter test mode actuator/indicator of claim 29 wherein said test mode indicia is on the end of said actuator/indicator closest to said digital meter readout, and overlies a portion of said readout when in the on position, but which is substantially concealed when in the off position.

31. The integral electric meter test mode actuator/indicator of claim 30 wherein said electronic digital meter bears no indication of its ability to provide and display a test mode when in the off position.

32. The integral electric meter test mode actuator/indicator of claim 31 wherein when said actuator indicator is moved toward said on position said test mode indicia is moved toward, and in line with, the column of information displayed by said digital meter readout.

33. The integral electric meter test mode actuator/indicator of claim 32 wherein said test mode indicia is moved toward said on position in a direction substantially perpendicular to the column of information displayed by said digital meter readout.

34. The integral electric energy meter test mode actuator/indicator of claim 28 wherein said switch is a rubber key switch having a resilient cup-shaped member extending toward said axially moveable connecting member, and a contact surface within the cup-shaped member which is positioned above conductors to be connected for actuation of said test mode.

35. The integral electric meter test mode actuator/indicator of claim 34 wherein said cup shaped member is mounted adjacent a printed circuit board including said conductors, and said resilient cup provides a snap action for said switch.

36. The integral electric energy meter test mode actuator/indicator of claim 8 wherein said switch actuator is positioned in an elongated slot in said test mode actuator/indicator, which slot includes an off position end, an intermediate cam surface, and an on stop surface at the other end thereof, such that movement of said test mode actuator/indicator and its cam surface past said switch actuator from the off position presses said switch actuator against the switch to actuate the test mode.

37. The integral electric energy meter test mode actuator/indicator of claim 36 wherein said elongated slot has rounded ends.

38. The integral electric energy meter test mode actuator/indicator of claim 37 wherein said switch actuator is a substantially cylindrical axially moveable shaft.

39. The integral electric energy meter test mode actuator/indicator of claim 36 wherein one or more buttons on said test mode actuator/indicator cooperate with a recess in said bezel to latch said test mode actuator/indicator in said off position to prevent accidental movement.

40. The integral electric energy meter test mode actuator/indicator of claim 39 wherein said one or more buttons are positioned on the free end of an integral tab on said actuator/indicator.

41. The integral electric energy meter test mode actuator/indicator of claim 38 wherein said bezel comprises a substantial portion of a cylinder with a flatted portion adjacent said meter readout.

* * * * *